(12) United States Patent
Pingree, Jr. et al.

(10) Patent No.: US 7,338,575 B2
(45) Date of Patent: Mar. 4, 2008

(54) HYDROCARBON DIELECTRIC HEAT TRANSFER FLUIDS FOR MICROWAVE PLASMA GENERATORS

(75) Inventors: Richard E. Pingree, Jr., New Market, MD (US); Michael Bruce Colson, Woodbine, MD (US); Michael Silbert, Sykesville, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 246 days.

(21) Appl. No.: 10/937,946

(22) Filed: Sep. 10, 2004

(65) Prior Publication Data
US 2006/0054281 A1   Mar. 16, 2006

(51) Int. Cl.
 C23C 16/00 (2006.01)
 C23F 1/00 (2006.01)
 H01L 21/306 (2006.01)

(52) U.S. Cl. ............... 156/345.41; 156/345.35; 156/345.36; 156/345.42; 156/345.46; 118/723 MW; 118/723 MR; 118/723 MA; 118/723 AN

(58) Field of Classification Search ....... 118/723 MW; 156/345, 36, 345.41
See application file for complete search history.

(56) References Cited

U.S. PATENT DOCUMENTS

| | | | |
|---|---|---|---|
| 3,749,812 A * | 7/1973 | Reynolds et al. | 174/25 R |
| 4,291,226 A * | 9/1981 | Rueggeberg | 250/324 |
| 4,341,592 A | 7/1982 | Shortes et al. | |
| 4,439,630 A * | 3/1984 | Groenhof | 174/21 R |
| 4,617,542 A * | 10/1986 | Lutz et al. | 335/196 |
| 5,498,308 A | 3/1996 | Kamarehi et al. | |
| 5,625,259 A * | 4/1997 | Holber et al. | 315/111.21 |
| 6,057,645 A | 5/2000 | Srivastava et al. | |
| 6,374,907 B1 | 4/2002 | Tousignant et al. | |
| 6,439,155 B1 | 8/2002 | Kamarehi et al. | |
| 6,703,324 B2 | 3/2004 | Wong | |
| 6,716,742 B2 | 4/2004 | Gates et al. | |
| 6,797,193 B2 * | 9/2004 | Brown et al. | 252/73 |
| 2002/0007912 A1 | 1/2002 | Kamarehi et al. | |
| 2004/0018319 A1 | 1/2004 | Waldfried et al. | |
| 2005/0047456 A1 * | 3/2005 | Rice | 372/35 |

FOREIGN PATENT DOCUMENTS

WO WO 97/37055 10/1997

OTHER PUBLICATIONS http://www.dynalene.com/lo230.html Printed Nov. 17, 2004 (1 page).
http://www.electronics-cooling.com/Resources/EC_Articles/MAY96/may96_04.htm Robert E. Simons, "Direct liquid immersion cooling for high power density microelectronics" Printed Jul. 21, 2004 (7 pages).
Gabriel et al., "Dielectric parameters relevant to microwave dielectric heating", Chemical Society Reviews, 1998, vol. 27 (pp. 213-223).

* cited by examiner

Primary Examiner—Parviz Hassanzadeh
Assistant Examiner—Rakesh K. Dhingra
(74) Attorney, Agent, or Firm—Cantor Colburn LLP

(57) ABSTRACT

A process and apparatus for cooling a plasma tube generally includes flowing a hydrocarbon dielectric heat transfer fluid into a space defined by the plasma tube and a concentric tube surrounding the plasma tube. In one embodiment, the hydrocarbon fluid is selected to have a dissipation factor less than 0.002 and a thermal efficiency coefficient greater than or equal to 1.30 kJ/kg*K.

9 Claims, 7 Drawing Sheets

HYDROCARBON DIELECTRIC HEAT TRANSFER FLUIDS FOR MICROWAVE PLASMA GENERATORS

BACKGROUND

The present disclosure generally relates to plasma generators employed in semiconductor manufacturing processes, and more particularly, to hydrocarbon dielectric heat transfer fluids, i.e., coolants, for use in microwave plasma generators.

Dielectric heat transfer fluids, i.e., coolants, can be used in many applications. One such application is for cooling dielectric barriers that are in direct contact with plasma. Plasma generators are frequently employed in semiconductor manufacture and it is generally required to employ dielectric heat transfer fluids to minimize the thermal stresses caused by the plasma on various components of the equipment.

A subset of plasma generators are microwave plasma generators. A microwave plasma asher typically includes a plasma tube in communication with a microwave source and a process chamber. The length of the tube is selected to encourage recombination of the more energetic particles along the length of the tube, forming stable, less damaging atoms and compounds. For example, less reactive F and O radicals reach the process chamber downstream of the microwave plasma source in greater proportions than high-energy ions. Because the process chamber is located downstream of the plasma source, this arrangement is generally referred to as a downstream plasma reactor. By creating a bend in the tube, the process chamber can be kept out of direct line of sight with the plasma, such that harmful UV radiation from the glow discharge does not reach the substrate.

The tube itself, however, places several limitations on the reactor. Conventionally, both the applicator and the transport tube are formed of quartz. Quartz exhibits advantageously low rates of O and F recombination, permitting these desired radicals to reach the process chamber while ions generated in the plasma source recombine. Unfortunately, quartz is highly susceptible to fluorine attack. Thus, the quartz transport tube and particularly the quartz applicator, which is subject to direct contact with the plasma, deteriorates rapidly and must be frequently replaced. Each replacement of the quartz tubing not only incurs the cost of the tubing itself, but more importantly leads to reactor downtime during tube replacement, and consequent reduction in substrate throughput.

An alternative material for applicators and/or transport tubes is sapphire ($Al_2O_3$). While highly resistant to fluorine attack, sapphire tubes have their own shortcomings. For example, sapphire transport tubes exhibit much higher rates of O and F recombination as compared to quartz, resulting in lower ash rates. Additionally, sapphire is susceptible to cracking due to thermal stresses created by the energetic plasma, limiting the power that can be safely employed. Lower plasma power means less generation of free radicals, which in turn also reduces the ash rate. While employing single-crystal sapphire somewhat improves the chemical resistance to fluorine relative to polycrystalline sapphire, safe power levels for single-crystal sapphire are still low compared to those which can be employed for quartz tubes. Moreover, bonding material at the joint between sapphire sections that create the bend in the transport tube, which prevents UV radiation from reaching the process chamber, is typically as susceptible to fluorine ion attack as is quartz.

In order to effectively minimize the thermal stresses, the plasma tube can be cooled with a dielectric heat transfer fluid or air. During operation, the dielectric heat transfer fluid or air is fed between two concentric tubes to provide cooling of the plasma tube. The primary purpose of the dielectric heat transfer fluid is to reduce thermal stresses within the plasma tube so as to prevent cracking. These thermal stresses are created by temperature differences across the tube geometry, which are generally caused by rapid and frequent collisions between energized particles and between such particles and the plasma tube walls.

Numerous properties are desired for dielectric heat transfer fluids to provide cooling to a microwave plasma device such as, for example, microwave transparency, which is generally indicated by a loss tangent function or dissipation factor. Absorption of microwave energy by the heat transfer fluid results in inefficiencies that can increase process times as well result in poor heat transfer since the absorption of microwave energy can cause heating of the fluid. Moreover, microwave absorption can also cause fragmentation of the fluid rendering the fluid unacceptable for its intended purpose. The fragments can cause an increase in dielectric constant as well as deleteriously affect the various fluid properties.

Apart from the use of air as a cooling medium, dielectric heat transfer fluids that have been or are currently employed for microwave plasma devices are perfluorinated liquids. While perfluorinated liquids are generally considered adequate for the intended use, these fluids are relatively expensive. Moreover, those perfluorinated liquids that are considered suitable in terms of its thermal, physical, chemical, and safety properties, generally have high vapor pressures. As such, perfluorinated fluids have a propensity to leak from closed loop systems. Although from a safety standpoint the loss of fluid may be acceptable, the costs of these fluids are relatively expensive. In addition, many of these perfluorinated fluids have relatively low boiling points making them susceptible to thermal breakdown, which can lead to reactive fragments. The reactive fragments can present health hazards as well as degrade the materials employed along the fluid path, e.g., o-rings, aluminum, leak lock thread sealants, polyurethane tubing, and the like. Consequently, these fluids can cause long-term performance issues and generally require frequent maintenance and inspection.

Accordingly, a need exists for alternative coolants that are microwave transparent, have adequate heat transfer capabilities, are environmentally friendly, and can provide lower costs of ownership.

BRIEF SUMMARY

Disclosed herein are coolants for a microwave plasma generator and methods for cooling plasma tube during microwave excitation of a gas mixture flowing through the plasma tube to for plasma. In one embodiment, a plasma apparatus comprises a plasma tube extending from a gas source through a microwave cavity to a process chamber; a microwave power source arranged to couple microwave energy to gas flowing through the tube within the microwave cavity; a concentric tube disposed about the plasma tube, wherein the concentric tube defines a space; and a hydrocarbon dielectric fluid in fluid communication with the space.

In another embodiment, the plasma apparatus comprises a plasma tube; a concentric tube paced apart from and surrounding the plasma tube; and a dielectric heat transfer fluid comprising a hydrocarbon fluid, wherein the hydrocarbon fluid is selected to have a dissipation factor less than 0.002 and a thermal efficiency coefficient greater than or equal to 1.30 kJ/l*K.

A process for cooling a plasma tube in a plasma device comprises flowing a hydrocarbon dielectric heat transfer fluid into a space defined by the plasma tube and a concentric tube surrounding the plasma tube.

The above described and other features are exemplified by the following figures and detailed description.

DETAILED DESCRIPTION

The present disclosure is directed to the use of hydrocarbon based dielectric heat transfer fluids for microwave plasma devices, wherein the hydrocarbon based dielectric fluid has at least one hydrogen bond. As will be discussed in greater detail, the hydrocarbon based dielectric heat transfer fluids provide effective cooling to a plasma tube during microwave plasma generation. In this manner, thermal stresses caused by the plasma on the plasma tube can be substantially prevented so as to prevent cracking of the plasma tube during operation. In addition to a significant cost reduction, the hydrocarbon based dielectric heat transfer fluids have numerous advantages relative to the use of other dielectric heat transfer fluids such as air, the perfluorinated fluids discussed above, and the like.

Figure 1:
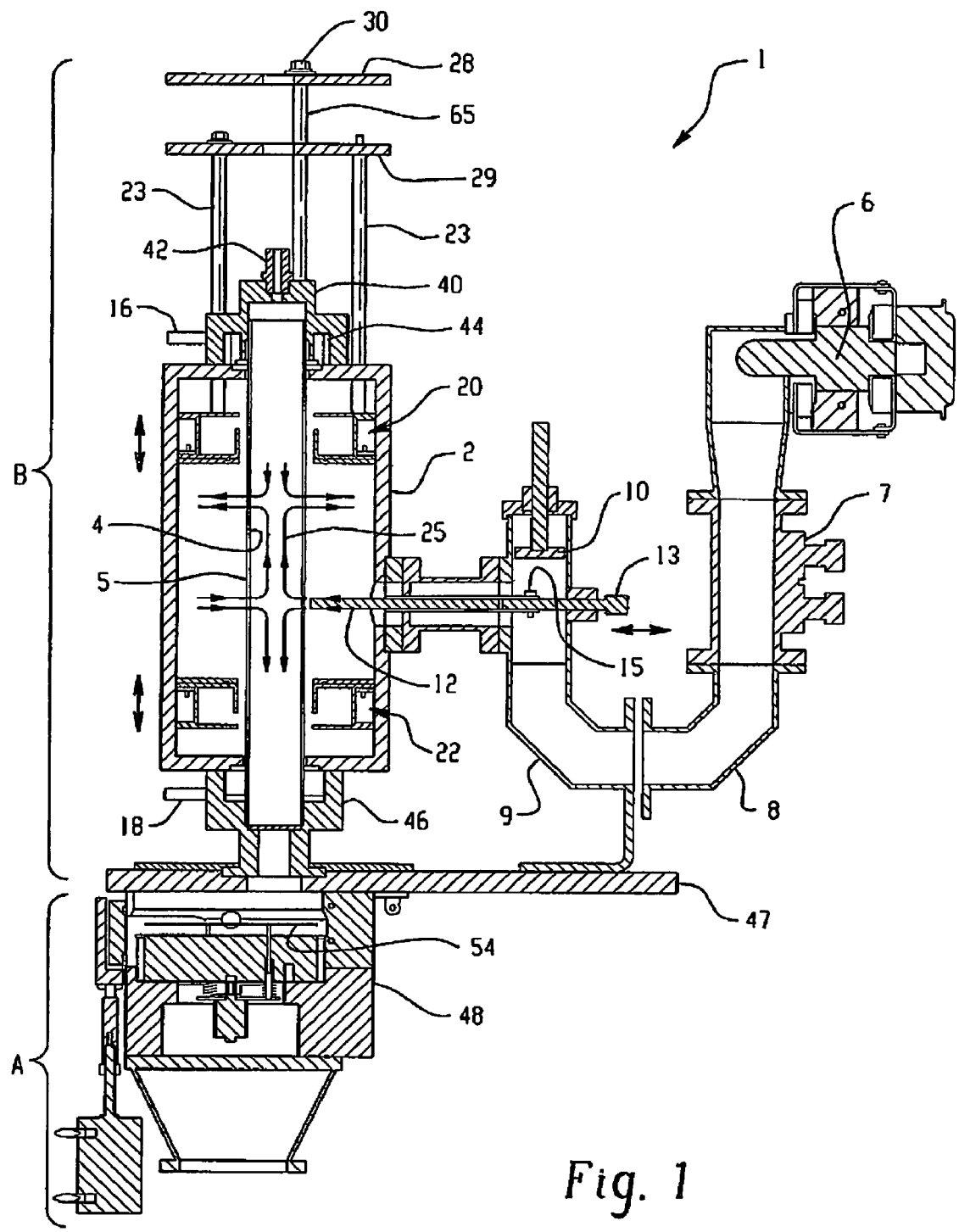
FIG. 1 is a cross sectional view of an exemplary microwave plasma discharge device.

Turning now to the drawings and in particular FIG. 1, an exemplary downstream microwave plasma device 1 is depicted and is suitable for use with the hydrocarbon based dielectric heat transfer fluids. The illustrated plasma asher device 1 generally includes a processing chamber A and a plasma generating component B connected to and in operative communication with the processing chamber A by a passageway. It is to be understood that the plasma-generating component B has been simplified to illustrate only those components that are relevant to an understanding of the present disclosure. Those of ordinary skill in the art will recognize that other components may be required to produce an operational plasma apparatus 1. However, because such components are well known in the art, and because they do not further aid in the understanding of the present disclosure, a discussion of such components is not provided.

Other downstream microwave plasma apparatuses particularly suitable for modification in the present disclosure are plasma ashers, such as for example, those axial flow microwave plasma ashers available under the trade name Fusion ES and commercially available from Axcelis Technologies Corporation. Portions of the microwave plasma asher are described in U.S. Pat. Nos. 6,057,645, 5,498,308 and 4,341,592, and PCT International Application No. WO/97/37055, herein incorporated by reference in their entireties. As will be discussed below, the disclosure is not limited to any particular microwave plasma generator in this or in the following embodiments. The hydrocarbon based dielectric heat transfer fluids disclosed herein provide effective cooling to the plasma tube during operation of the microwave plasma device.

Referring to the Figures, longitudinally extending cylindrical microwave cavity 2 is depicted, which has cylindrical plasma tube 4 running therethrough. The plasma tube may be made of quartz or sapphire, or other substance, which is appropriate for the gas that is used. The device is cooled by providing a surrounding quartz tube 5 close to and concentric with plasma tube 4, and feeding the hydrocarbon dielectric fluid in the space between the tubes 4, 5. The space is in fluid communication with an inlet 16 and an outlet 18, which are suitably arranged to permit flow of the hydrocarbon dielectric heat transfer fluid into and out of the space through the use of a supply system.

In order to excite the gas flowing in plasma tube 4 to a plasma state, microwave excitation must be provided. To this end, microwave source 6, e.g., a magnetron, generates microwave power which is fed through directional coupler 7 to a waveguide having mutually perpendicular sections 8 and 9. The length of section 9 is controlled with moveable short 10, which may be a fixed member rather than a moveable member, if desired. An antenna 12 in the form of a metallic rod is provided for coupling microwave power from the waveguide to the cavity via a waveguide to coaxial transition. The antenna extends through a circular opening in the cavity wall into the cavity, and its degree of insertion is adjustable. The adjustment is accomplished by pushing or pulling on member 13 which is attached to antenna 12 with pin 15, thus causing antenna 12 to move in and out of the cavity. Member 13 is made of a low loss electrical insulator of low dielectric constant, e.g., polytetrafluorethylene, to prevent microwave leakage through the insertion hole. A screw mechanism including a stepping motor may be provided for automating the insertion and retraction of the antenna. As described above, the antenna adjustment allows the coupling of the field to the cavity to be optimized for specific operating conditions and increases the operating window of the system.

The ends of the microwave cavity are defined by microwave traps 20 and 22. Such traps are a very effective way of preventing microwave leakage since they electrically reduce the microwave current to zero. The traps may be of the type disclosed in U.S. Pat. No. 5,498,308, the entire disclosure of which is incorporated herein by reference. Each microwave trap is a resonant circuit in which the microwave current is reduced to zero.

Figure 2:
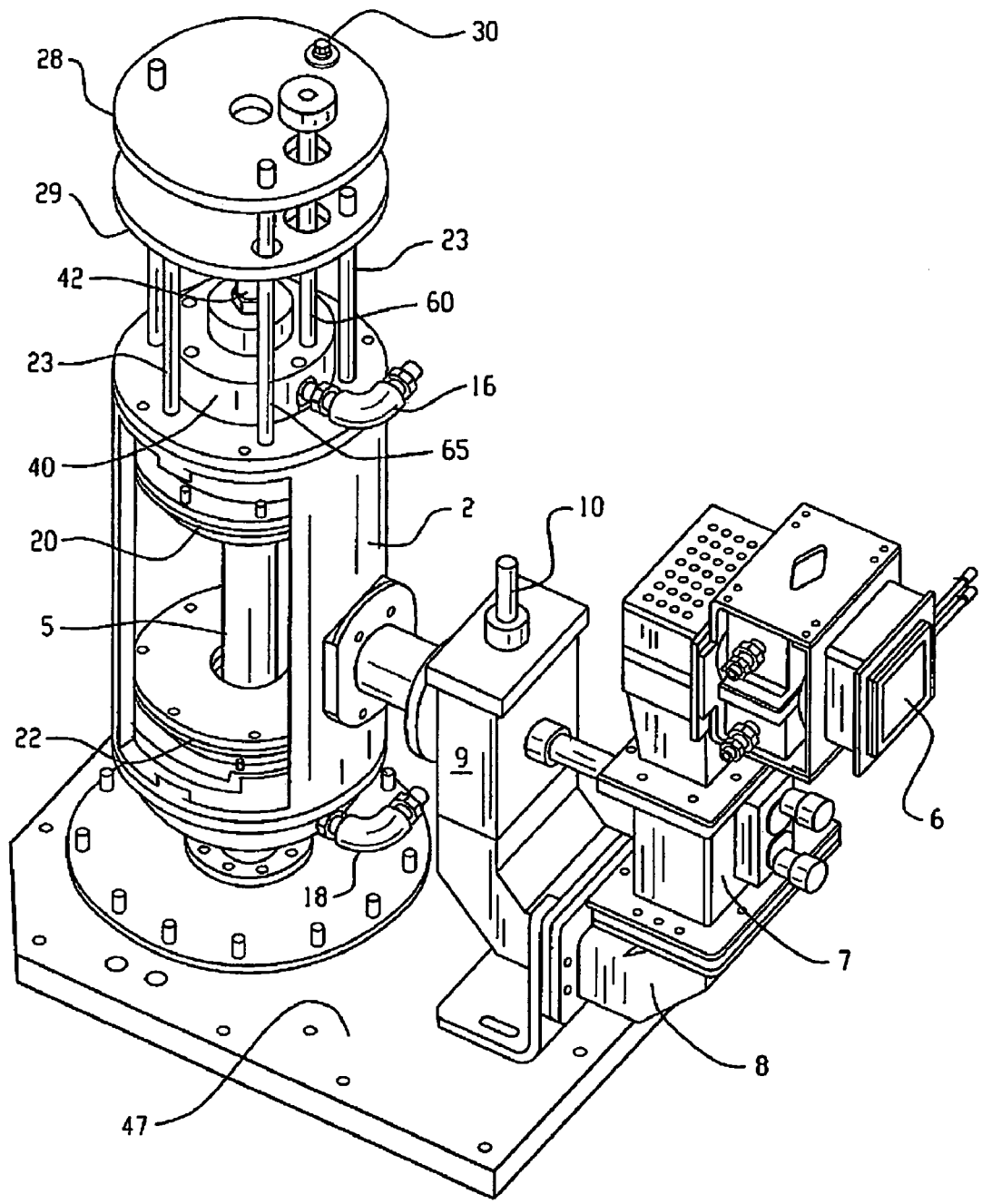
FIG. 2 is a partial perspective view of the exemplary microwave plasma discharge device of FIG. 1.

Additionally, a screw mechanism may be provided for conveniently effecting the adjustment of the traps, and such a mechanism is shown in connection with the top trap 20 in the FIGS. 1 and 2. It is comprised of horizontal (in the Figures) members 28 and 29, and vertical (in the Figures) cylindrical members 23, 65, and 60. There are three members 23, (not all shown) which connect the top of top trap 20 to member 29. There are three members 65, (not all shown) which connect the top of the microwave cavity to member 28, where they are secured with nuts 30 (only one shown). Member 60 is threaded, as is an opening in member 29 through which in turn raises or lowers the microwave trap 20. If desired a stepper motor may be employed in a configuration for automating the raising and lowering of the trap. A similar mechanism (not shown) can be employed for moving the bottom trap 22.

The adjustment of the cavity length provides a broad range of dynamic cavity tuning, and is what permits the device to be operated with different gasses over a wide range of process conditions. As is known to those skilled in the art, utilizing a different gas will change the load impedance and resonant frequency of the cavity, and effectivity of the cavity, thereby detuning it. Re-tuning may be accomplished by experimenting with the positions of the slidable traps to establish a resonant $TM_{012}$ mode in the cavity, if desired. That is, the cavity is nominally dimensioned to result in the $TM_{012}$ mode, and the dynamic tuning permits resonance to be maintained over a variety of process gasses. In addition to the use of different gasses, a broad range of process conditions, e.g., gas flow, pressure, input power, etc. can be accommodated.

While the disclosure is operable by making the position of only one trap adjustable, a big advantage is afforded when both traps are moveable. This is because the position of each trap may be independently changed in relation to the position of the antenna, thus affording a greater range of effective tuning.

Referring to FIG. 1, it is seen that end cap 40 is provided which abuts the top of the cavity, while fitting 42 having a central orifice for admitting gas to the plasma tube extends into the end cap. The plasma tube is supported at this end by O-ring 44 in the end cap. End member 46 is provided at the other end to provide the proper spacing in relation to bottom plate 47 and the process chamber 48, while this end of the plasma tube has an opening in it for emission into the process chamber.

In the operation of the device, oxygen, fluorine containing gas, or other gas is fed into gas inlet 42, which feeds plasma tube 4. The microwave cavity is tuned to achieve a resonant $TM_{012}$ mode by adjusting the position of slidable microwave traps 20 and 22, and matching of the cavity impedance with plasma to the characteristic impedance of the coaxial section is accomplished by adjusting the insertion of antenna 12 into the cavity. Plasma is excited in the gas, the afterglow of which is emitted from an opening at the end of the plasma tube into process chamber 48. The plasma or the afterglow from the plasma can be used to remove material from a substrate, i.e., wafer.

The $TM_{012}$ field configuration is depicted in FIG. 1 at reference numeral 25. To prevent cracking of a sapphire plasma tube, it is desirable to prevent unequal heating of the tube, and a field configuration having azimuthal and longitudinal uniformity will accomplish this. The $TM_{012}$ field has azimuthal uniformity (not shown), and as seen in FIG. 1 also has adequate longitudinal uniformity. Thus, it has been found that use of the $TM_{012}$ field configuration obviates cracking of the plasma tube, and as mentioned above, does not require a cavity that uses partitioning.

The process chamber 48 can include retractable wafer support pins that support wafer 54, to be processed. A chuck can be arranged to provide heating, if desired, to the wafer during processing. One or more baffle plates (not shown) may be present above the wafer to promote even distribution of the plasma The settings and optimization for particular microwave plasma generators will be well within the skill of those in the art in view of this disclosure. For exemplary purposes only, in a 300 mm Fusion ES3 downstream microwave plasma asher available from Axcelis Technologies, Inc., the wafers are preferably heated in the reaction chamber to a temperature between room temperature and 450° C. The temperatures used during processing may be constant or alternatively, ramped or stepped during processing. Increasing the temperature is recognized by those skilled in the art as a method to increase the ashing rate. More preferably, the wafers are heated to temperatures ranging from 350° C. to 450° C. The pressure within the reaction chamber is preferably reduced to about 1 torr or more. More preferably, the pressure is operated in a range from about 1 torr to about 4 torr. An excitable gas mixture is fed into the plasma-generating chamber via a gas inlet. The gas mixture is exposed to an energy source within the plasma-generating chamber, e.g., microwave energy, preferably between about 1,000 W and 4,000 W, to generate excited or energetic atoms from the gas mixture. The generated plasma is comprised of electrically neutral and charged particles formed from the gases used in the plasma gas mixture. The charged particles are selectively removed prior to plasma reaching the wafer. The total gas flow rate is preferably from about 500 to 12,000 standard cubic centimeters per minute (sccm) for the 300 mm downstream plasma asher. The photoresist, polymers and residues are selectively removed, i.e., ashed from the wafer by reaction with the excited or energetic atoms generated by the plasma. The reaction may be optically monitored for endpoint detection as is recognized by those in the art.

It has unexpectedly been found that a dielectric heat transfer fluid comprising a hydrocarbon fluid can be employed to effectively cool the plasma tube during operation. A dielectric material is generally defined as one which contains either a permanent or induced dipoles, which when placed between two electrodes acts as a capacitor, i.e., the material allows charge to be stored and no dc conductivity is observed between the plates. At the molecular level, polarization involves either the distortion of the distribution of the electron cloud within a molecule or the physical rotation of the molecular dipoles. Compounds that have large dipoles generally have large dielectric constants, because the dielectric polarization depends primarily on the ability of the dipoles to rotate in the applied electric field. In general, suitable hydrocarbon fluids are substantially non-polar fluids, which have no permanent dipole moment and no relaxation processes in the microwave region and are therefore substantially transparent to microwaves.

In a preferred embodiment, the dielectric heat transfer fluid comprises an aliphatic hydrocarbon. A suitable aliphatic hydrocarbon dielectric heat transfer fluid is an aliphatic hydrocarbon blend commercially available under the trade name Dynalene LO-230 from the Dynalene Company Applicants have surprisingly discovered that the use of certain hydrocarbon fluids, such as the Dynalene LO-230 noted above, can provide suitable microwave transparency as well as overcome some of the problems noted in the prior art relating to perfluorinated dielectric heat transfer fluids. In one embodiment, the hydrocarbon fluids have a dissipation factor of less than 0.002, with less than 0.001 more preferred, and with less than 0.0005 even more preferred.

In our exemplary embodiment, the fluid, Dynalene LO-230 has been tested at 2.45 Ghz. and the dissipation factor is estimated to be less than 0.002. Given this result, it is also generally recognized that it is highly likely that the dissipation factor at frequencies below 2.45 Ghz is also less than 0.002. (Reference "Dielectric Materials and Applications" Von Hippel. Therefore it should be considered that aliphatic hydrocarbons can be used in similar applications at lower frequencies i.e. 1 Mhz-2.45 Ghz. Also, it is desirable that the hydrocarbon fluid be selected to have a thermal efficiency coefficient greater than or equal to 1.30 kJ/lK (kilojoules/liter·degrees Kelvin), wherein thermal efficiency coefficient is defined as a function of the specific gravity times heat capacity. The dielectric constant is preferably less than 4.0, with less than 2.0 more preferred, and with less than 1.5 even more preferred.

The dissipation factor can be measured in accordance with ASTM D924 entitled, "Test Method for Dissipation Factor (or Power Factor) and Relative Permittivity (Dielectric Constant) of Electrical Insulating Liquids", 2003. Specific Gravity is measured relative to water at 20° C. Heat capacity can be measured using standard calorimetric techniques generally known to those skilled in the art.

Figure 3:
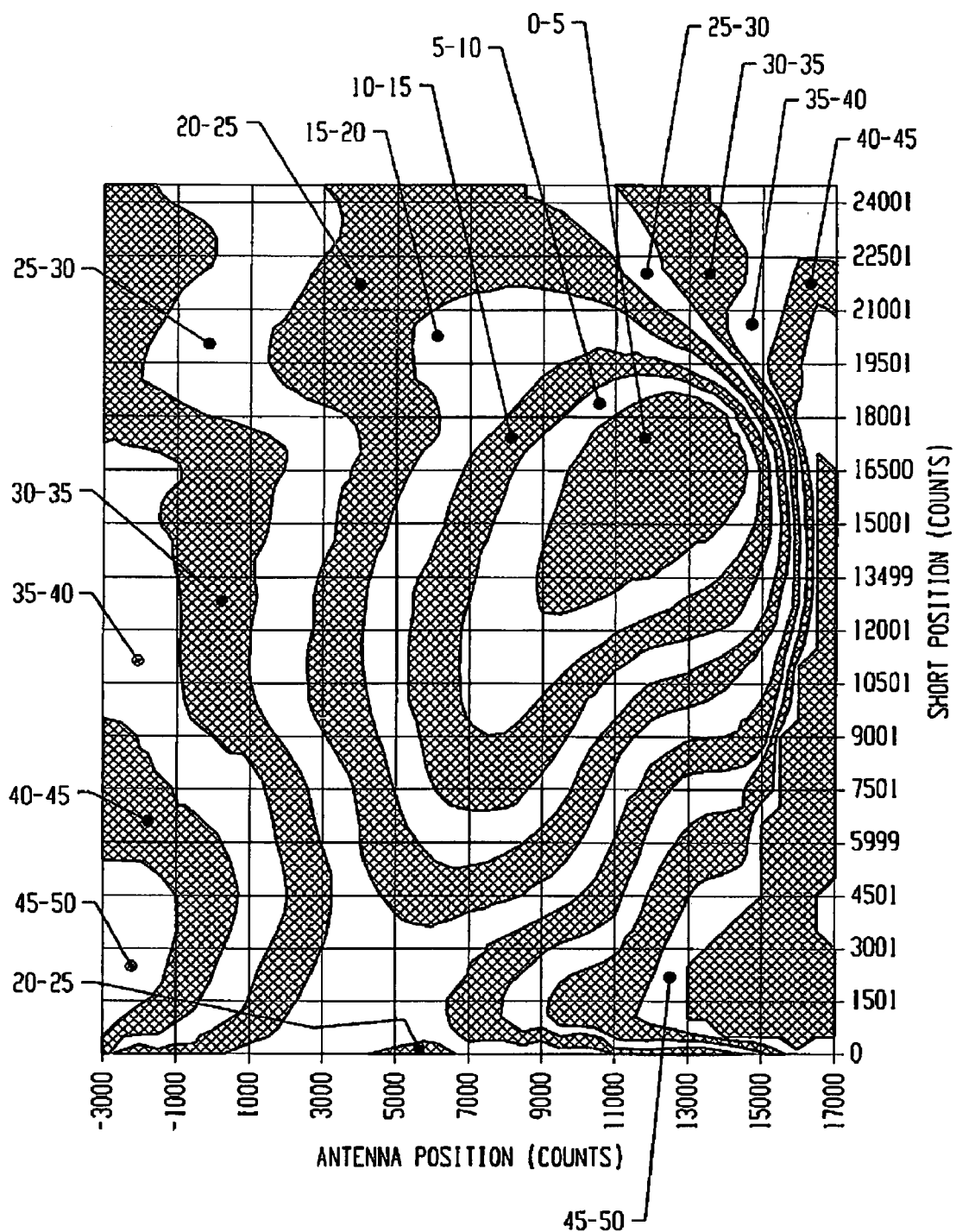
FIGS. 3 though 6 graphically illustrate the (magnitude of reflection coefficient)^2(% reflected power) for two degrees of tuning freedom, and for two different process conditions in a microwave plasma discharge device employing a hydrocarbon based dielectric heat transfer fluid.
Figure 4:
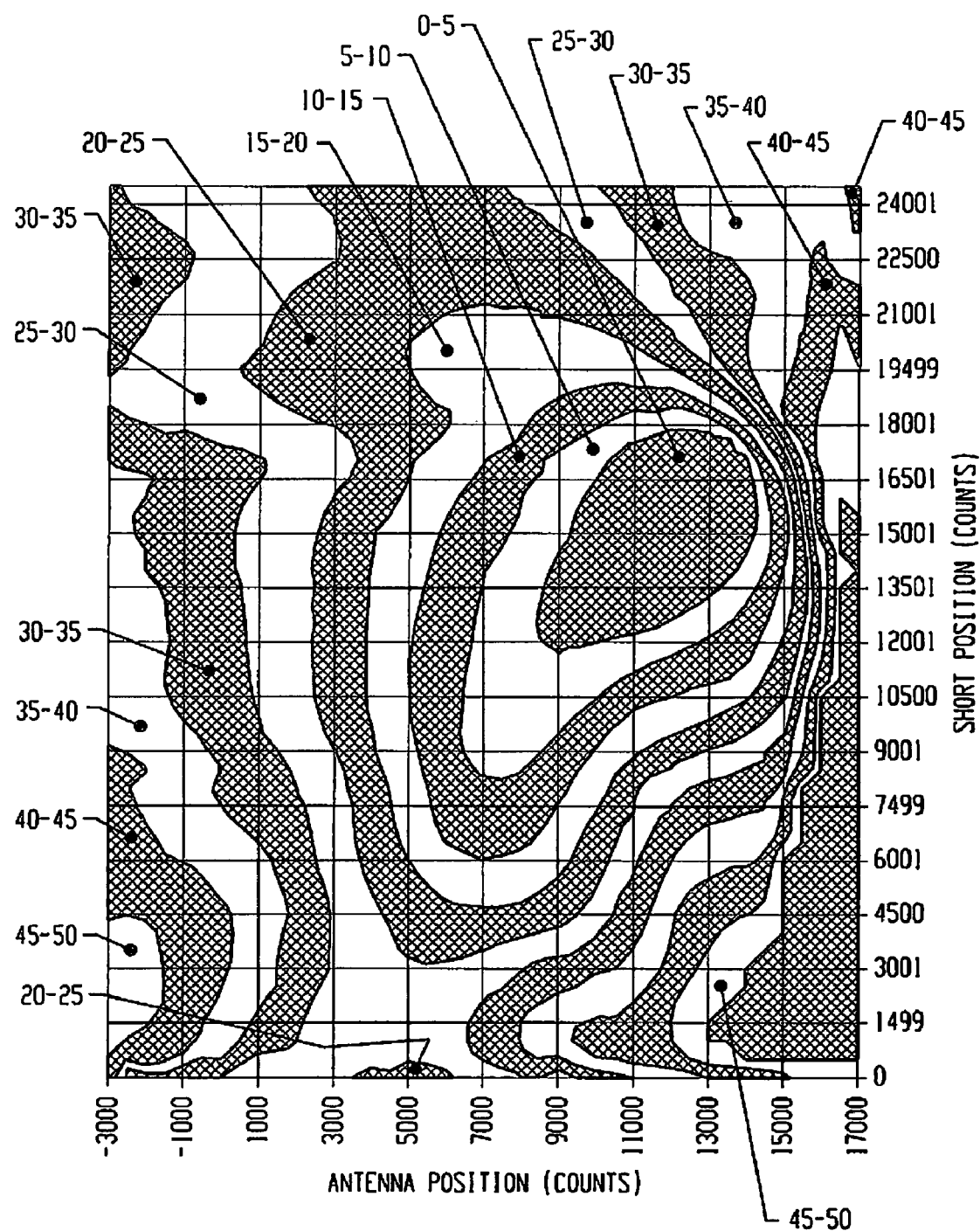
Figure 5:
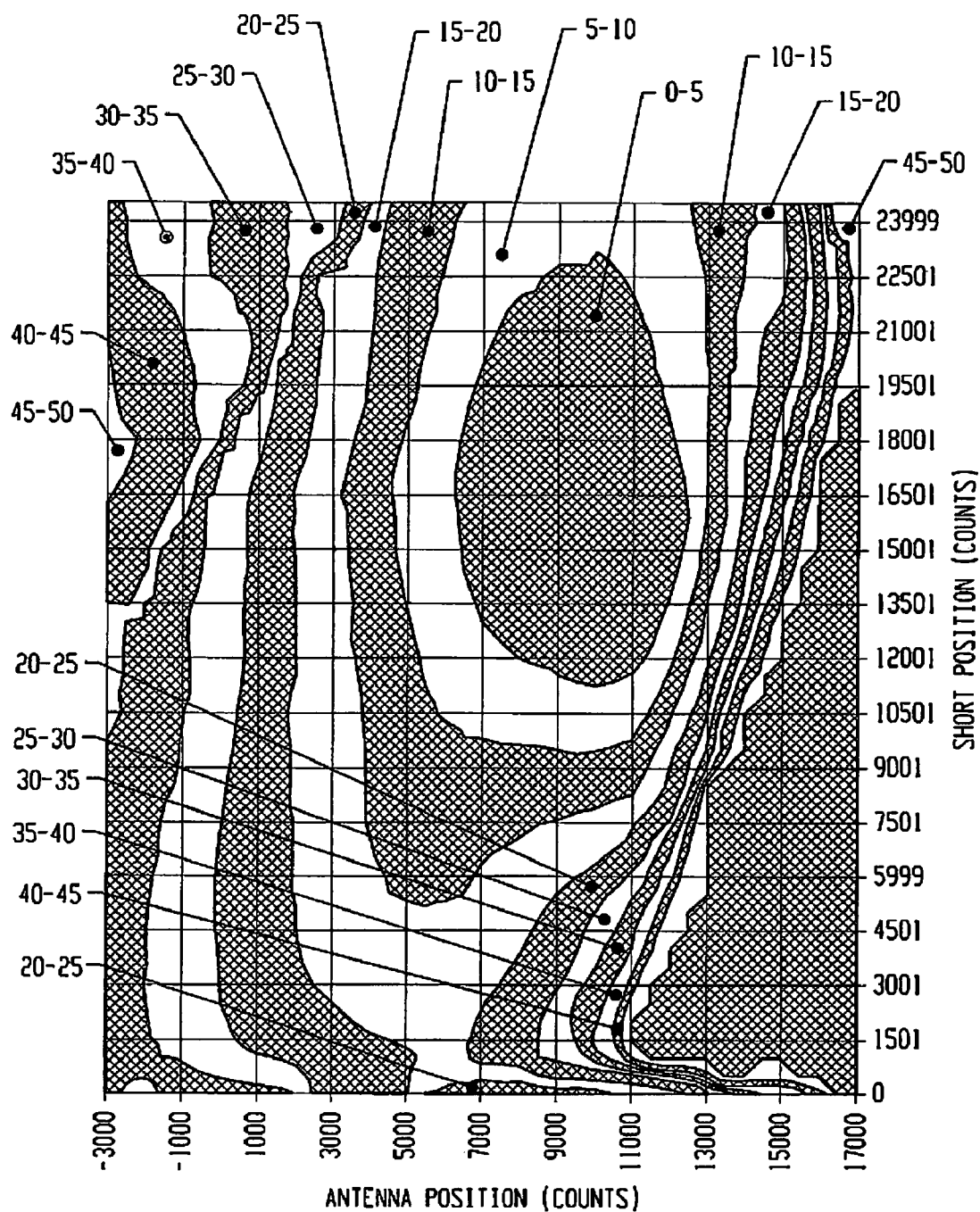
Figure 6:
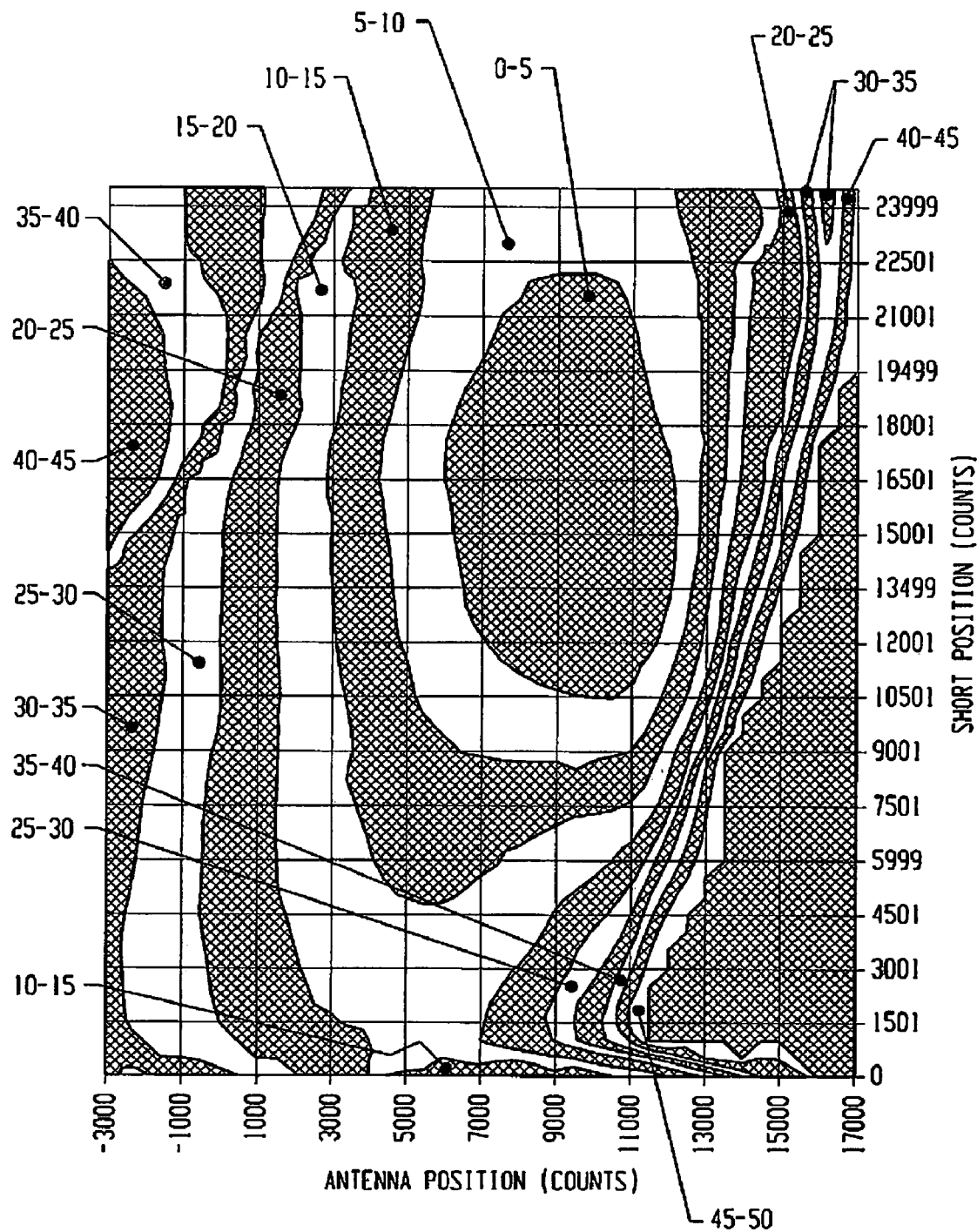

FIGS. 3 and 4 graphically illustrate the (magnitude of reflection coefficient)^2(% reflected power) for two degrees of tuning freedom in a microwave plasma discharge device employing Dynalene LO-230 (a blend of aliphatic hydrocarbons). As shown, there were no adverse effects to the microwave circuit as a result of using an H-bond dielectric heat transfer fluid. FIGS. 3 through 6 compare the impedance characteristics of the loaded cavity with plasma using FC-3283 and LO-230 for two different process conditions. If there were changes in either the dielectric constant of the fluid or plasma characteristics (e.g., electron density, etc) changes in the size, shape, and/or location of the reflected power contours would be observed. Comparing FIGS. 3 and 5 or 4 and 6, a difference in size, shape, and location of the reflected power contours is observed. This is believed to be due to the change in plasma characteristics resulting from changing process gases. Comparing FIGS. 3 and 4 as well as FIGS. 5 and 6, where only the dielectric cooling fluid is changed, it is observed that there is no resulting change in impedance characteristics.

Figure 7:
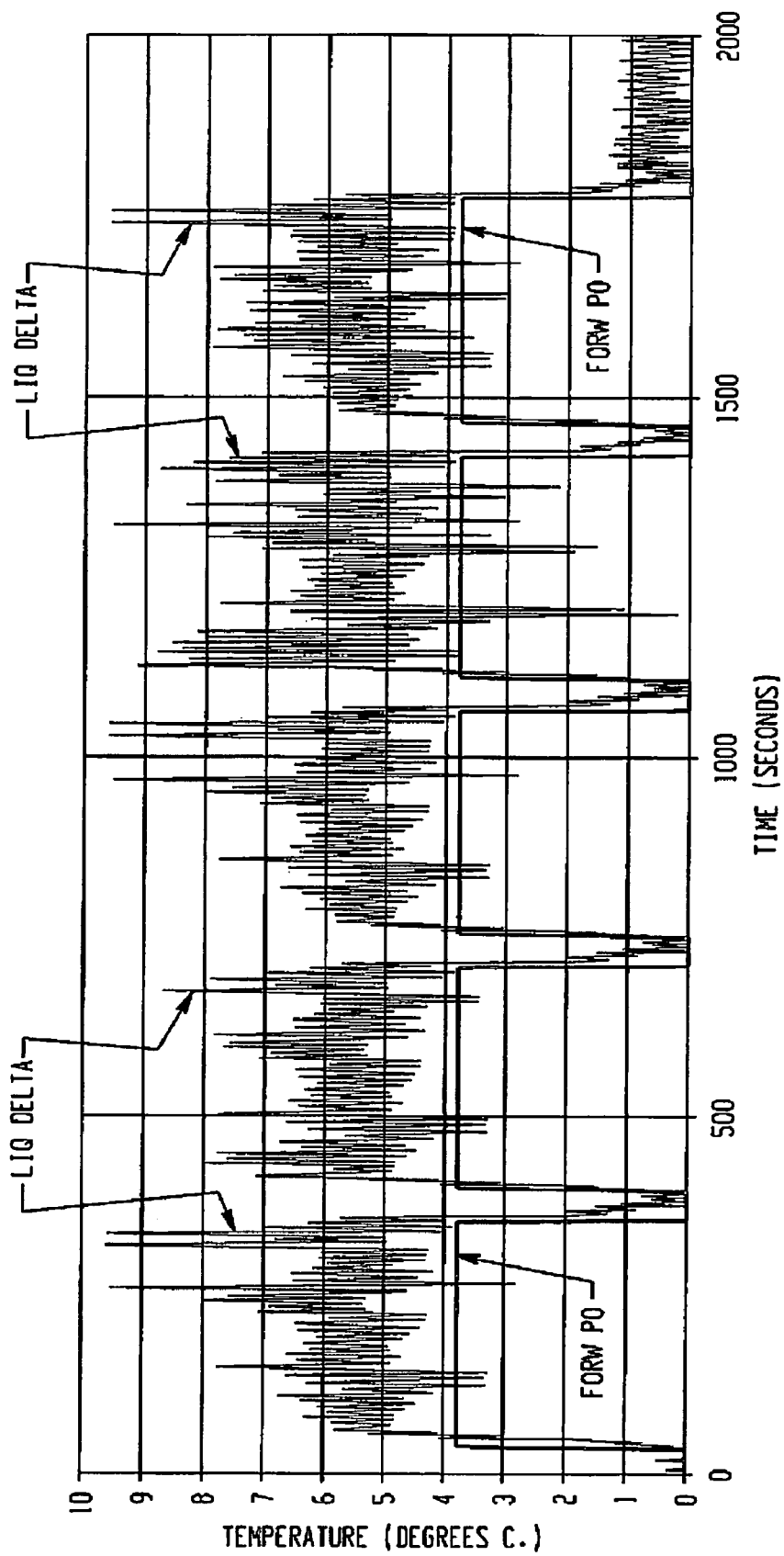
FIG. 7 graphically illustrates a difference in temperature of the dielectric fluid measured at the fluid inlet and outlet of the plasma generation region as a function of time for a microwave plasma discharge device employing a hydrocarbon dielectric heat transfer fluid as a coolant.

FIG. 7 graphically illustrates the differences in output and input steady state temperatures of a hydrocarbon based dielectric heat transfer fluid across the heat source, i.e., plasma tube. Dynalene LO-230 had a flow rate of 2 gallons per minute through the space defined by the plasma tube and the concentric tube. As shown, heat (approximately 1,250 W) was effectively removed from the plasma tube by the fluid resulting in a 6° C. change in temperature.

Table 1 provides a comparison of ashing rates and wafer-to-wafer repeatability for a perfluorinated dielectric heating fluid and a hydrocarbon based dielectric heating fluid. Two temperatures (270 and 120° C.) were used to compare the process performance of the respective fluids. The other process parameters were equivalent for both tests and were the same parameters used for the impedance testing of FIGS. 3 and 4, i.e., input power was 3,800 W, pressure was 1.2 torr, O2 flow was 9,200 sccm, $N_2H_2$ flow was 800 sccm, $CF_4$ flow was 20 sccm. The perfluorinated dielectric heating fluid was FC-3283 available from the 3M company whereas the hydrocarbon based dielectric heating fluid was Dynalene LO-230. A comparison of the dielectric heat fluid properties is provided in Table 2. The operating parameters of the microwave plasma discharge device were identical for each fluid. The fluids flowed through space defined by the plasma tube and the concentric tube at a flow rate of about 2 gallons per minute. The results indicate that the hydrocarbon based dielectric heating fluid was comparable in ashing relative to the perfluorinated fluid.

TABLE 1

|  | FC-3283 | Dynalene LO-230 |
|---|---|---|
| High Temp Ashing Rate (um/min) | 100% | 100.07% |
| High Temp wafer-wafer (1 sigma) | 1% | 0.45% |
| Low Temp Ashing Rate (um/min) | 100% | 96.9% |
| Low Temp wafer-wafer (1 sigma) | 1.3% | 0.7% |

TABLE 2

| PROPERTY | ALIPHATIC HYDROCARBON BLEND (DYNALENE LO-230) | PERFLUORINATED (FC-3283) |
|---|---|---|
| Dielectric constant | 1.95 | 1.9 |
| Dissipation factor | <0.002 | <0.002 |
| Heat capacity (kJ/kg*K) | 2.10 | 1.1 |
| Boiling point (0° C.) | 273 | 128 |
| Specific Gravity at 20° C. | 0.82 | 1.82 |
| Thermal conductivity (W/m*K) | 0.147 | 0.066 |
| Viscosity at 0° C. (cP) | 37 | 1.4 |
| Vapor pressure (Pa) | <133 | 1,440 |
| Flash point (°C.) | 110 | N/A |
| Thermal Efficiency Coefficient (kJ/l*K) | 1.72 | 2.00 |
| Cost (U.S. Dollars)/gallon | 30 | 490 |

As demonstrated in Table 1, Dynalene LO-230 retains the advantages of the perfluorinated fluid yet overcomes some of the problems noted in the prior art. The dissipation factor of the hydrocarbon based dielectric fluid was comparable to the perfluorinated fluid. Moreover, the hydrocarbon blend has a lower vapor pressure making coolant loop seals less critical. In terms of light absorption and exposure to high surface temperatures, the performance of the aliphatic hydrocarbon blend exhibited no thermal breakdown after a period of about 3 months of simulated use. During the simulated use, the duty cycle of "heat load on time" was increased and the heat load was selected to be the most extreme under these conditions. In addition to gas chromatography, which produced no evidence of thermal breakdown, flash point was measured before and after use. A decrease in thermal flash point would be indicative of thermal breakdown. During use, the flash point did not change.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A plasma apparatus comprising:
   a plasma tube extending from a gas source through a microwave cavity to a process chamber;
   a microwave power source arranged to couple microwave energy to gas flowing through the tube within the microwave cavity;

a concentric tube disposed about the plasma tube, wherein the concentric tube defines a space; and a hydrocarbon dielectric fluid in fluid communication with the space, wherein the hydrocarbon dielectric fluid is an aliphatic hydrocarbon.

2. The plasma apparatus of claim 1, wherein the hydrocarbon fluid is selected to have a dissipation factor less than 0.002 and a thermal efficiency coefficient greater than or equal to 1.30 kJ/l*K.

3. The plasma apparatus of claim 1, wherein the dissipation factor is less than 0.001.

4. The plasma apparatus of claim 1, wherein the dissipation factor is less than 0.0005.

5. A plasma apparatus comprising:

a plasma tube;

a concentric tube paced apart from and surrounding the plasma tube; and a dielectric heat transfer fluid comprising a hydrocarbon fluid, wherein the hydrocarbon fluid is selected to have a dissipation factor less than 0.002 and a thermal efficiency coefficient greater than or equal to 1.30 kJ/l*K.

6. The plasma apparatus of claim 5, wherein the dissipation factor is less than 0.001.

7. The plasma apparatus of claim 5, wherein the dissipation factor is less than 0.0005.

8. The plasma apparatus of claim 5, wherein the hydrocarbon fluid has a dielectric constant less than 4.0.

9. The apparatus of claim 1, wherein the hydrocarbon fluid is non-polar and has a vapor pressure less than 133 Pascals.

\* \* \* \* \*